United States Patent [19]

Ralph

[11] Patent Number: 5,534,830
[45] Date of Patent: Jul. 9, 1996

[54] THICK FILM BALANCED LINE STRUCTURE, AND MICROWAVE BALUNS, RESONATORS, MIXERS, SPLITTERS, AND FILTERS CONSTRUCTED THEREFROM

[75] Inventor: Loren E. Ralph, Citrus Heights, Calif.

[73] Assignee: R F Prime Corporation, Sacramento, Calif.

[21] Appl. No.: 368,551

[22] Filed: Jan. 3, 1995

[51] Int. Cl.⁶ .................. H01P 5/10; H01P 5/12; H01F 5/00; H01G 4/06
[52] U.S. Cl. .................. 333/128; 333/26; 333/117; 333/204; 333/238; 333/5; 336/200; 361/311
[58] Field of Search .................. 333/4, 5, 1, 26, 333/116, 117, 128, 238, 246; 336/200; 361/301.1, 311

[56] References Cited

U.S. PATENT DOCUMENTS

| | | | |
|---|---|---|---|
| 3,260,972 | 7/1966 | Pusch | 333/238 |
| 3,381,244 | 4/1968 | Dalley | 333/116 |
| 3,621,486 | 11/1971 | Gunshinan et al. | 333/246 |
| 4,260,963 | 4/1981 | Drapac | 333/238 X |
| 4,382,236 | 5/1983 | Suzuki | 333/1 |
| 4,724,182 | 2/1988 | Kato et al. | 428/210 |
| 4,774,127 | 9/1988 | Reagan et al. | 428/209 |
| 4,785,202 | 11/1988 | Toyoda | 333/246 X |
| 4,835,038 | 5/1989 | Kaneko et al. | 428/209 |
| 4,847,003 | 7/1989 | Palanisamy | 252/514 |
| 4,891,259 | 1/1990 | Moran | 428/209 |
| 4,939,022 | 7/1990 | Palanisamy | 428/209 |
| 4,954,790 | 9/1990 | Barber | 332/164 |
| 5,025,232 | 6/1991 | Pavio | 333/26 |
| 5,061,910 | 10/1991 | Bouny | 333/26 |
| 5,135,595 | 8/1992 | Acocella et al. | 156/89 |
| 5,139,851 | 8/1992 | Acocella et al. | 428/209 |
| 5,304,959 | 4/1994 | Wisherd et al. | 333/26 |
| 5,389,735 | 2/1995 | Bockelman | 333/4 X |

FOREIGN PATENT DOCUMENTS 148405 8/1984 Japan .................. 333/26

OTHER PUBLICATIONS

Barber, Richard G., Enhanced Coupled, Even Mode Terminated Baluns and Mixers Constructed Therefrom, IEEE MTT-S Digest, 1990, pp. 495–498.

Primary Examiner—Paul Gensler
Attorney, Agent, or Firm—John P. O'Banion

[57] ABSTRACT

A thick film balanced line multilayered structure having a substrate base of nominal 0.025 or 0.030 inch thick ceramic material, a first metal layer deposited on the substrate base, a nominal 0.003 inch thick dielectric layer deposited over and around the first metal layer, and a second metal layer deposited on top of the dielectric layer in alignment with, and parallel to, the first metal layer. The structure defines a standard circuit cell suitable for use as a balun, a capacitor or an autotransformer, for use in microwave mixers, power splitters, filters, resonators and other microwave devices. The impedance of the cell is controlled by the width of the metal layers, and ranges from 5 ohms to 125 ohms, and the frequency of the cell is controlled by the length of the metal layers.

11 Claims, 5 Drawing Sheets

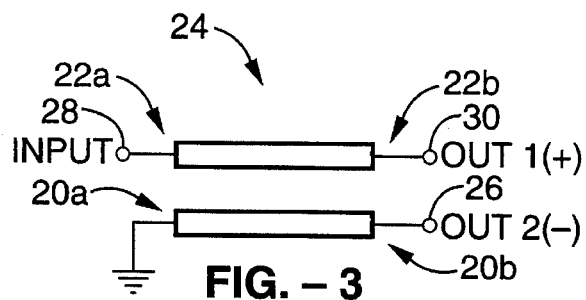
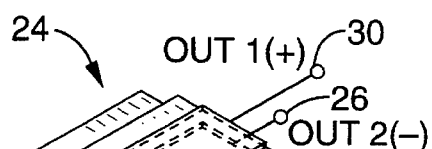
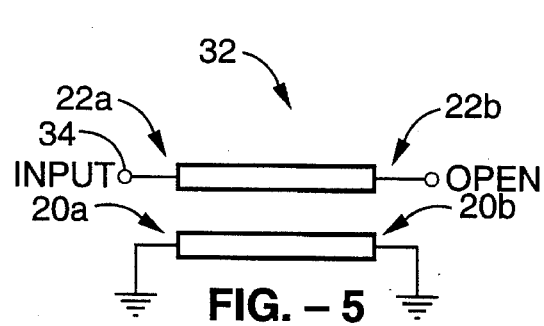
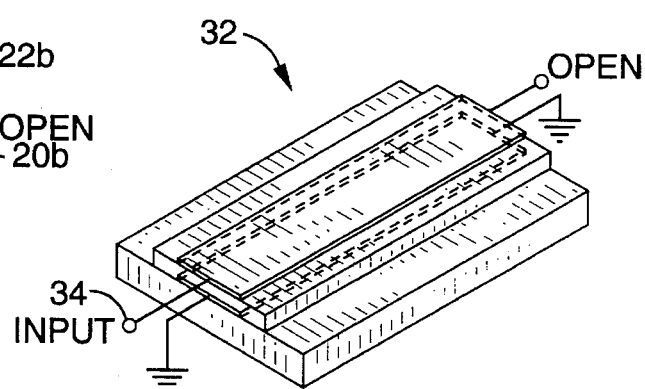
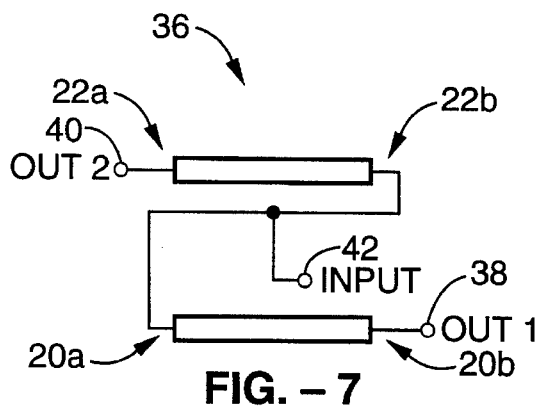
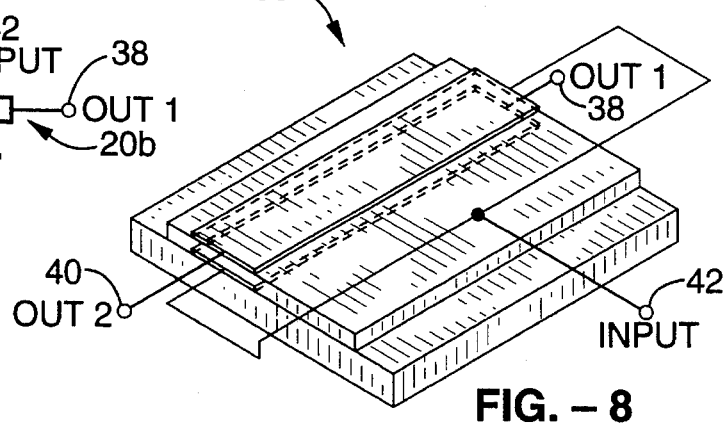

THICK FILM BALANCED LINE STRUCTURE, AND MICROWAVE BALUNS, RESONATORS, MIXERS, SPLITTERS, AND FILTERS CONSTRUCTED THEREFROM

BACKGROUND OF THE INVENTION

1. Field of the Invention

The present invention pertains generally to passive microwave structures using a thick film construct, and more particularly to a thick film balanced line structure for use in the construction of microwave mixers, power splitters, and filters.

2. Description of the Background Art

Microwave balanced line structures have been fabricated from many types of mediums. For example, three-dimensional structures have been typically fabricated from thin ceramic, PTFE soft board, or Teflon®-based dielectric materials suspended in air, using various twisting techniques to fabricate the substrate. For typical structures having an impedance of 50 ohms, however, the line widths range from 0.020 to 0.030 inches which makes it difficult to place long line structures in a small area. Further, assembly is tedious and requires manual labor, and the thin dielectric materials used do not lend themselves to automated manufacturing or commonly used surface mount assembly techniques. At lower frequencies these structures are constructed using twisted copper wire wrapped around ferrite core materials. However, these structures are large and bulky, involve manual assembly techniques, and do not work well at microwave frequencies. Another type of known balun, as described in U.S. Pat. No. 4,954,790, uses a multilayer approach on thin film, with edge coupled lines requiring tight tolerances and exacting construction. Although this structure lends itself well to surface mount construction, it is expensive to manufacture.

Because balanced line structures are used in the construction of microwave mixers, power splitters and filters, there is need for a balanced line structure which is low in cost, repeatable to manufacture, and compatible with commonly used surface mount assembly techniques. The present invention satisfies that need, as well as others, and overcomes the deficiencies found in the previously developed devices.

SUMMARY OF THE INVENTION

The present invention pertains generally to a thick film balanced line structure comprising a substrate base, a first metal layer deposited on the substrate base, a dielectric layer deposited over and around the first metal layer, and a second metal layer deposited on top of the dielectric layer. By way of example, and not of limitation, the substrate base comprises a nominal 0.025 or 0.030 inch thick ceramic material used as a support structure. The first metal layer comprises a thick film gold trace printed on top of the substrate base. The dielectric material comprises a nominal 0.0026 to 0.0038 inch thick layer printed on top of the this first metal layer, with the desired microwave characteristics. The second metal layer comprises a thick film gold trace is printed on top of the dielectric layer. By defining the specific dimensional and electrical requirement of this multilayer structure, a standard circuit cell is created that can be used to fabricate baluns for mixers, autotransformers and capacitors for power splitters, and resonators for filter designs. The impedance of the cell, which is controlled by the width, not the thickness, of the metal layers ranges from 5 ohms to 125 ohms, making the device suitable for high Q circuits used in such devices.

It is therefore the object of this present invention to provide a thick film, multilayer construct for use as the balanced line structures in microwave balun, autotransformers, capacitors, and resonators.

Another object of the invention is to describe the utilization of such structures to implement microwave mixer designs.

Another object of the of this invention is to describe the use of this structure in the design of a unique microwave power splitter design.

An additional object of this invention is to demonstrate the use of the described structure for use as a resonator in microwave frequency filters.

In addition, said assemblies are constructed in a manner such that the manufacturing of said designs can be done using automated assembly equipment, and the final construction can be attached using automated surface mount attachment equipment.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only:

FIG. 3 is a schematic representation the balanced transmission line cell of the present invention configured as a balun.

FIG. 4 is a diagrammatic perspective view of a balun corresponding to the schematic diagram of FIG. 3.

FIG. 5 is a schematic representation of the balanced transmission line cell of the present invention configured as a shunt capacitor.

FIG. 6 is a diagrammatic perspective view of a shunt capacitor corresponding to the schematic diagram of FIG. 5.

FIG. 7 is a schematic representation of the balanced transmission line cell of the present invention configured as an autotransformer.

FIG. 8 is a diagrammatic perspective view of an autotransformer corresponding to the schematic diagram of FIG. 7.

DESCRIPTION OF THE PREFERRED EMBODIMENTS

Figure 1:
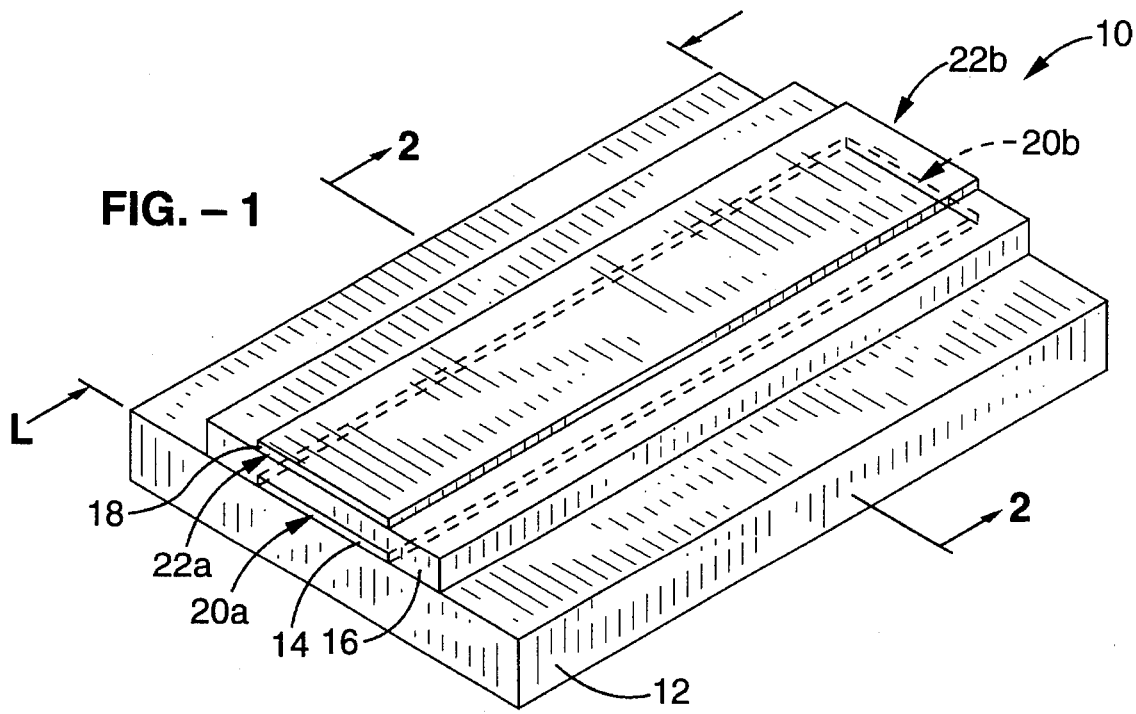
FIG. 1 is a diagrammatic perspective view of a balanced transmission line cell in accordance with the present invention.
Figure 2:
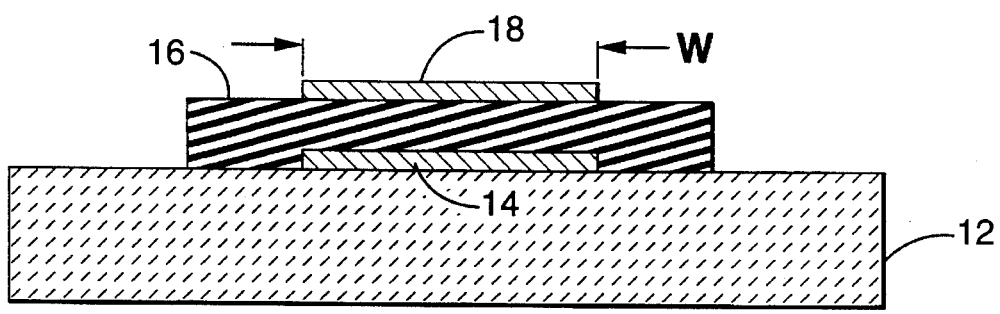
FIG. 2 is a cross-sectional view of the balanced transmission line cell shown in FIG. 1 taken through line 2—2.

Referring more specifically to the drawings, where: like reference numerals denote like parts, for illustrative purposes the present invention is embodied in the apparatus generally shown in FIG. 1 and FIG. 2, as well as various microwave devices fabricated therefrom, examples of which are shown in FIG. 4 through FIG. 12. It will be appreciated that the apparatus may vary as to configuration and as to details of the parts without departing from the basic concepts as disclosed herein.

Referring to FIG. 1 and FIG. 2, a balanced transmission line cell 10 in accordance with the present invention is formed on a substrate base 12 which serves as a support structure. Substrate base 12 is typically fabricated from a high alumina content ceramic material, such as 96% alumina or the like. The thickness of substrate base 12 is preferably either 0.025 or 0.030 inches in thickness, depending on ate lead frame used and overall package height. Using standard thick film print and fire assembly techniques, a gold paste 8 microns to 12 microns thick and having a width W is deposited on top of substrate base 12 to form a first metal trace 14. Gold is preferred since it is a low loss material at microwave frequencies, has fine deposition resolution, and is compatible with wire bond operations. The gold thickness range specified above was found to provide for optimum adhesion during automatic gold wire bonding. A dielectric layer 16 is then deposited over and around first metal trace 14 by multiple print and fires of the dielectric material until a uniform layer with a consistent thickness is created. Preferably, dielectric layer 16 will have a dielectric constant of ten, but can range from six to ten. Also, while the thickness of dielectric layer 16 can range from approximately 0.0026 to 0.0038 inches, a nominal thickness of 0.003 inches provides superior results and scalability for a 0.005. inch line width and fifty ohm line impedance. Further, if the dielectric layer is too thin, there is risk of pinholes being created as well as undesirable breakdown voltages. Therefore the thick dielectric layer employed in the present invention is fabricated by multiple firings and is considerable less susceptible to pinholes than conventional thin dielectric layers. A second metal trace 18 of gold is deposited on top of dielectric layer 16 in the same manner as first metal trace 14, again with a thickness of between 8 microns to 12 microns. Second metal trace 18 is deposited in alignment with, and parallel to, first metal trace 14.

The width W of the printed gold conductors comprising first and second metal traces 14, 18 which form the transmission lines determines the impedance of the balanced transmission line cell 10. The length L of the transmission lines determines the frequency of operation, and is preferably selected to be close to one quarter of the desired frequency wavelength in said dielectric medium for optimum performance. The cell includes two ports 20a, 20b on first metal trace 14 and two ports 22a, 22b on second metal trace 18, that can be connected in various configurations. For example, referring to FIG. 3 and FIG. 4 which shows a balun configuration 24, port 20a is electrically coupled to ground, an output terminal 26 is electrically coupled to port 20b, an input terminal 28 is electrically coupled to port 22a, and an output terminal 30 is electrically coupled to port 22b. Referring to FIG. 5 and FIG. 6, which shows a shunt capacitor configuration 32, ports 20a, 20b are electrically coupled to ground, an input terminal is electrically coupled to port 22a, and port 22b is left uncoupled. Referring to FIG. 7 and FIG. 8, which shows an autotransformer configuration 36, port 20a is electrically coupled to port 22b, an output terminal 38 is electrically coupled to port 20b and an output terminal 40 is electrically coupled to port 22a. The input terminal 42 is electrically coupled to the approximate midpoint of the electrical connection between port 20a and port 22b.

Figure 9:
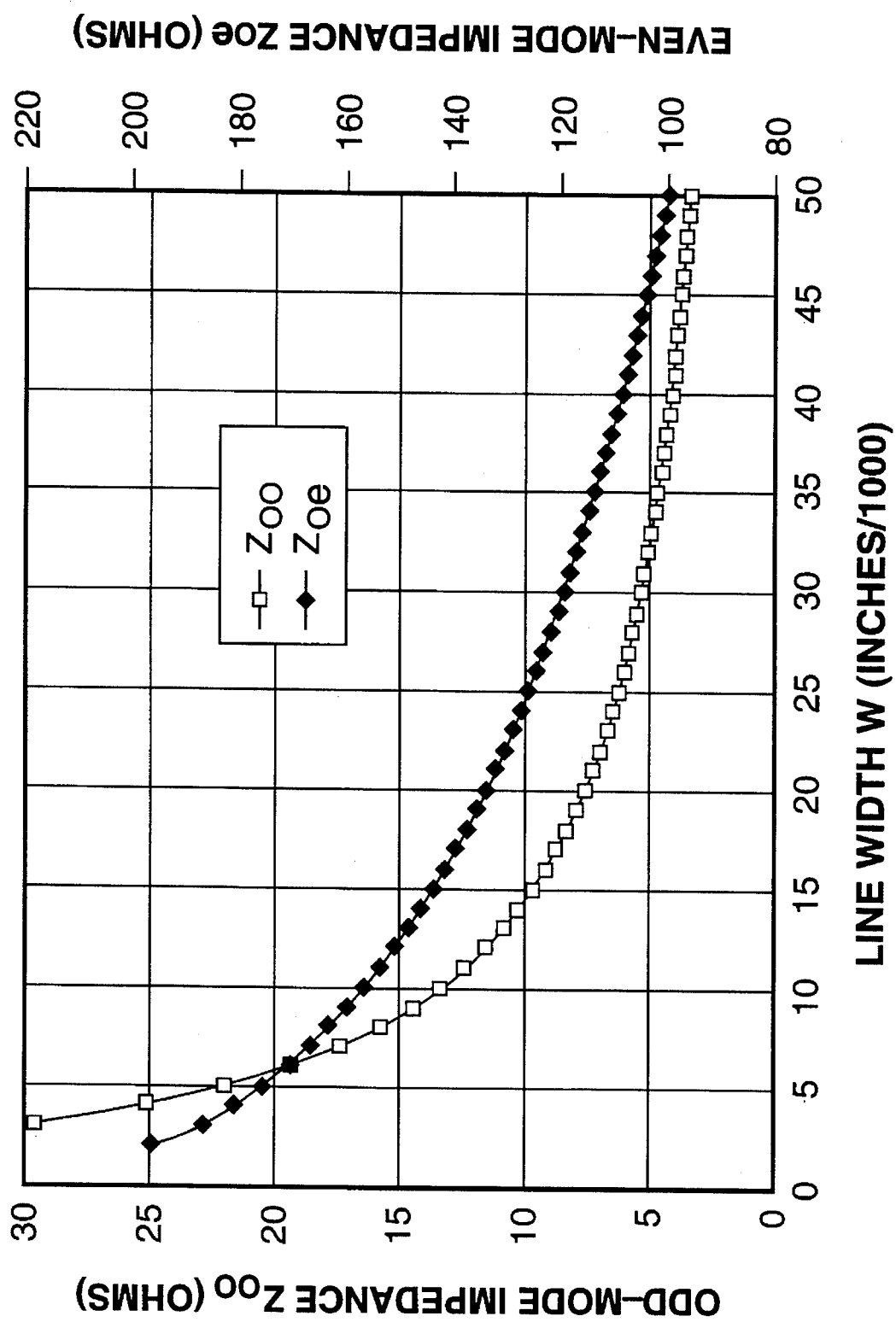
FIG. 9 is graph showing impedance as a function of line width for the present invention.

A four line balanced transmission line structure is defined to have two modes of propagation, an even mode and odd mode. Referring to FIG. 9, the impedances are plotted as a function of line width W in thousandths of an inch for a balanced transmission line cell 10 in accordance with the present invention. The left vertical axis represents the odd mode impedance $Z_{oo}$ in ohms, which is also referred to as the coupled impedance, and the right vertical axis represents the even mode impedance $Z_{oe}$ in ohms, also known as the common mode impedance, for a dielectric constant of nine. In this regard, note that the line impedance is determined by multiplying the odd mode impedance by a factor of two.

Figure 10:
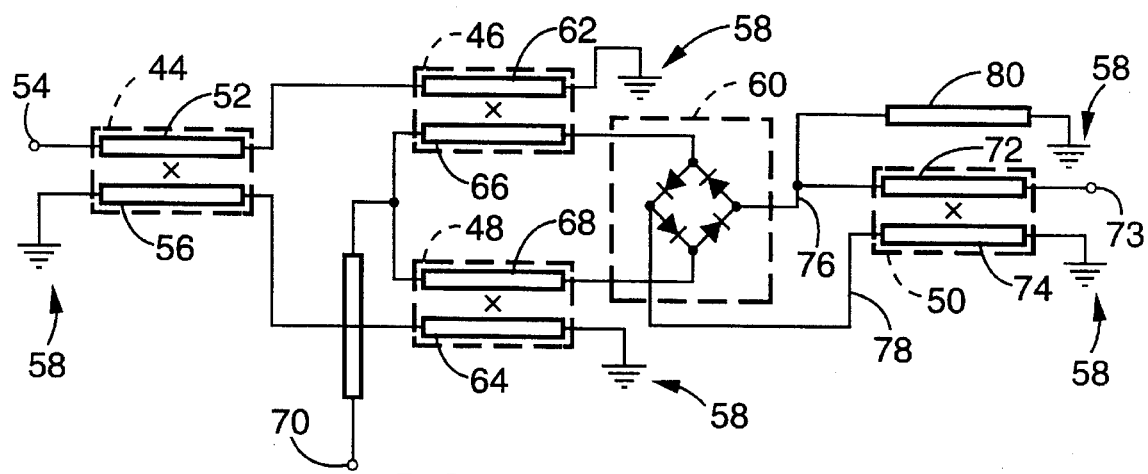
FIG. 10 is a schematic representation of a microwave mixer employing balanced transmission line cells in accordance with the present invention.

Referring to FIG. 10, a mixer employing four balanced transmission line cells 10 in accordance with the present invention is shown. Cells 44, 46, 48 and 50 represent four cells of the present invention. Cells 44 and 50 employ line widths of 0.005 to 0.006 inches, giving a balanced impedance of approximately 50 ohms. Cells 46 and 48 employ line widths of 0.011 to 0.013 inches, giving a balanced impedance of approximately 25 ohms. The length of each of the cells 44, 46, 48 and 50 is approximately equal to one quarter wavelength at the center of the desired operating frequency.

Cell 44 includes a first conductor 52, one end of which is the input for the local oscillator source 54. The corresponding end of second conductor 56 is connected to ground 58. The corresponding opposite ends of conductors 52 and 56 constitute a balanced source with impedances of 25 ohms relative to ground.

Cells 46 and 48 comprise a pair of inverting transmission line structures, coupling the balanced output from cell 44 to a diode quad 60. The output of conductor 52 is coupled to one end of conductor 62, the other end of which is coupled to ground 58. Similarly, the output of conductor 56 is coupled to one end of conductor 64, the other end of which is coupled to ground 58. The opposing conductors 66, 68 are tied together at one end and coupled to the intermediate frequency (IF) output terminal 70 of the mixer.

Cell 50 includes a first conductor 72, one end of which is coupled to the radio frequency input terminal 73. The corresponding end of conductor 74 is coupled to ground 58. The opposite ends of conductors 72, 74 constitute a balanced output, connecting to the diode quad 60 at interconnections 76, 78 as shown. A single transmission line 80 connects from interconnection 76 to ground 58, and provides improved ground return balance for cell 50, as well as the required direct current return path connection for the IF frequency during the conversion process.

Figure 11:
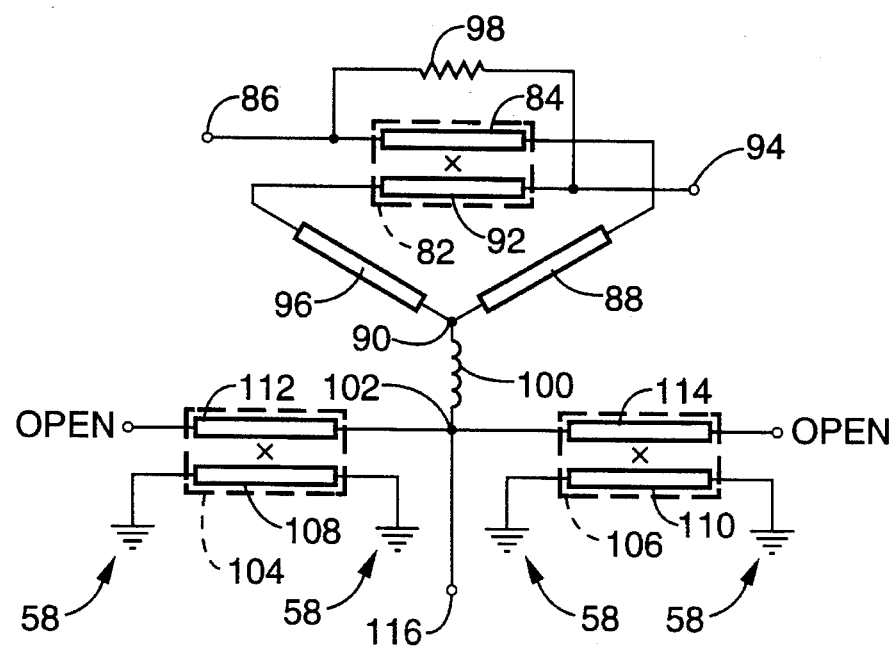
FIG. 11 is a schematic representation of a two-way, zero-degree power splitter employing balanced transmission line cells in accordance with the present invention.

Referring to FIG. 11, a two-way, zero-degree power splitter employing three balanced transmission line cells 10 in accordance with the present invention is shown. Cell 82 is configured as a microwave autotransformer 36 as shown in FIG. 7 and FIG. 8. Cell 82 includes a conductor 84 having a first output 86 at one end. The opposite end of conductor 84 is connected via a very short length of transmission line 88 to node 90. The corresponding end of conductor 92 is used as the second output 94. The opposite end of conductor 92 is connected via another very short transmission line 96 to node 90. A printed resistor 98 of approximately 100 ohms in value is connected between first output 86 and second output 94. The autotransformer input at node 90 is connected via bond wires 100 to the splitter input at node 102. A pair of cells 104, 106 configured as capacitors 32 as shown in FIG. 5 and FIG. 6 are coupled to node 102, and serve as tuning capacitors. The line widths employed in cells 104, 106 are such that the line impedance is approximately 5 ohms, and the line lengths are much shorter than a quarter wavelength. The bottom conductors 108, 110 are connected to ground 58 at each end. One end of each of the top conductors 112, 114 are connected to node 102, and the opposite ends are left unconnected. Cells 104, 106 can be analyzed either as short balance transmission lines, or parallel plate capacitors with given dielectric constant.

Operation of the power splitter is such that a signal of proper frequency applied at input terminal 116 is equally split at output terminals 86 and 94, with a power reduction of 3 dB, plus any conductor losses. Cells 104 and 106 help to match the input impedance to 50 ohms. A signal input at output terminal 94 is phase shifted 180 degrees when arriving at output port 86. This phase differential causes a power absorption in the resistor 98, effectively providing isolation between output terminals 86 and 94. The center frequency of operation of the power splitter is determined by the length and impedance of cell 82.

Figure 12:
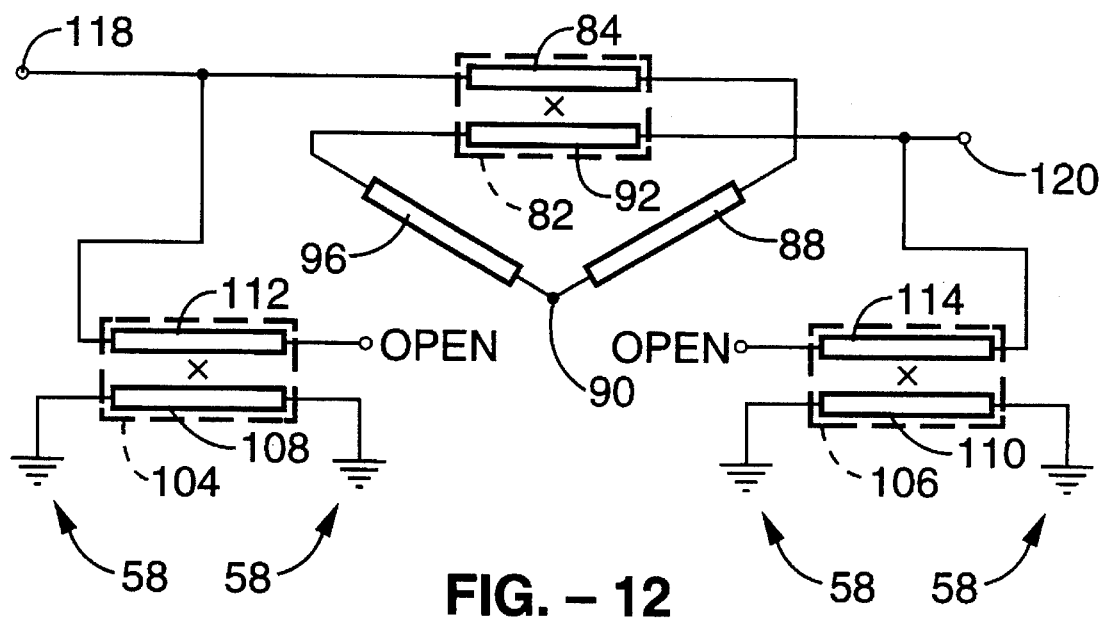
FIG. 12 is a schematic representation of a low pass filter employing balanced transmission line cells in accordance with the present invention.
Figure 13:
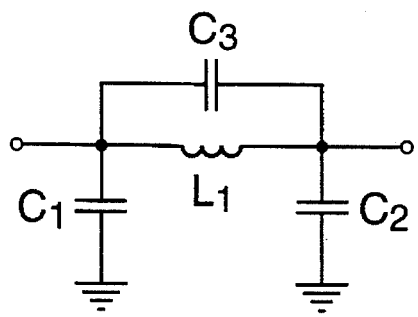
FIG. 13 is a schematic diagram of an equivalent circuit representation of the low pass filter of FIG. 12.

Referring now to FIG. 12, a microwave low pass filter employing balanced transmission line cells 10 in accordance with the present invention is shown. The filter employs an autotransformer cell 82 as shown in FIG. 11. However, in this configuration node 90 is left unconnected, and a resistor is not connected between the outputs of cell 82. Further, the filter input 118 is coupled to one end of conductor 84 as shown, and the filter output 120 is taken from the opposite end of conductor 92. Note also that cells 104 and 106, which are the same microwave capacitors as in FIG. 11, are coupled to filter input 118 and filter output 120, respectively, instead of to node 90 (through bond wires 100) as in the splitter of FIG. 11. FIG. 13 shows an electrical equivalent schematic of the low pass filter, where cells 104 and 106 correspond to capacitors C1 and C2, and cell 84 approximately corresponds to the parallel combination of C3 and L1.

Accordingly, it will be seen that this invention provides a balanced transmission line cell which can be used in the construction of microwave baluns, resonators, mixers, splitters, filters and other devices which employ balanced transmission line structures. Using a nominal dielectric thickness of 0.003 inches and a dielectric constant of ten, the transmission lines employed in the present invention have repeatable line widths of approximately 0.004 to 0.005 inches for a 50 ohm impedance. These thin lines, which are approximately 80% less width than in conventional printed balanced line structures, allow for maximum component densities by meandering the lines on the substrate, resulting in reduction of the overall size of the microwave device being fabricated. While thinner lines could be used, 0.005 inches is preferred for reproducibility. Further, the controlled thickness and dielectric constant provide a constant, distributed capacitance and inductance per unit length, creating a balanced transmission line.

Although the description above contains many specificities, these should not be construed as limiting the scope of the invention but as merely providing illustrations of some of the presently preferred embodiments of this invention. Thus the scope of this invention should be determined by the appended claims and their legal equivalents.

I claim:

1. A thick film balanced transmission line cell, comprising:
   (a) a dielectric substrate base;
   (b) a first continuous metal trace, said first metal trace print and fire deposited on said substrate base, said first metal trace having a width W and a length L, said first metal trace having first and second ends;
   (c) a dielectric layer, said dielectric layer print and fire deposited over and around said first metal trace, said dielectric layer having a thickness ranging from approximately 0.0026 inches to approximately 0.0038 inches, said dielectric layer having a dielectric constant ranging from approximately 6 to approximately 10; and
   (d) a second continuous and exposed metal trace, said second metal trace print and fire deposited on said dielectric layer, said second metal trace having said width and said length L, said second metal trace having first and second ends, said second metal trace aligned with and generally parallel to said first metal trace over said width W and said length L, said first end of said second metal trace aligned with said first end of said first metal trace, said second end of said second metal trace aligned with said second end of said first metal trace;
   (e) wherein said first and second metal traces form a balanced transmission line having a line impedance and operational frequency, said line impedance determined by said width W, said operational frequency determined by said length L.

2. A thick film balanced transmission line cell as recited in claim 1, wherein said dielectric layer has a nominal thickness of 0.003 inches and a dielectric constant of approximately 10.

3. A thick film balanced transmission line cell as recited in claim 2, wherein said trace width of said first and second metal traces is 0.005 inches nominal.

4. A thick film balanced transmission line cell as recite in claim 1, wherein said substrate base comprises a high alumina content ceramic material.

5. A thick film balanced transmission line cell as recited in claim 1, further comprising:
   (a) an input terminal electrically connected to said first end of said second metal trace;
   (b) a first output terminal electrically connected to said second end of said second metal trace; and
   (c) a second output terminal electrically connected to said second end of said first metal trace;
   (d) said first end of said first metal trace electrically connected to ground.

6. A thick film balanced transmission line cell as recited in claim 1, further comprising:
   (a) an input terminal electrically connected to said first end of said second metal trace;
   (b) said first and second ends of said first metal trace electrically connected to ground.

7. A thick film multilayer microwave construct, comprising:
   (a) a high alumina content ceramic substrate base;
   (b) a first continuous metal trace, said first metal trace print and fire deposited on said substrate base, said first metal trace having a width W and a length L, said first metal trace having first and second ends;
   (c) a dielectric layer print and fire deposited over and around said first metal trace, said dielectric layer having a nominal thickness of 0.003 inches, said dielectric layer having a dielectric constant ranging from approximately 6 to approximately 10; and (d) a second continuous and exposed metal trace, said second metal trace print and fire deposited on said dielectric layer, said second metal trace having a said width W and said length L, said second metal trace having first and second ends, said second metal trace aligned with and generally parallel to said first metal trace over said width W and said length L, said first end of said second metal trace aligned with said first end of said first metal trace, said second end of said second metal trace aligned with said second end of said first metal trace;

(e) wherein said first and second metal traces form a balanced transmission line having a line impedance and operational frequency, said line impedance determined by said width W, said operational frequency determined by said length L.

8. A thick film multilayer microwave construct as recited in claim 7, further comprising:

(a) an input terminal electrically connected to said first end of said second metal trace;

(b) a first output terminal electrically connected to said second end of said second metal trace;

(c) a second output terminal electrically connected to said second end of said first metal trace;

(d) said first end of said first metal trace electrically connected to ground.

9. A thick film balanced transmission line cell, comprising:

(a) a dielectric substrate base;

(b) a first metal trace deposited on said substrate base, said first metal trace having a trace width and a trace length, said first metal trace having first and second ends;

(c) a first output terminal electrically connected to said second end of said first metal trace;

(d) a dielectric layer deposited over said first metal trace;

(e) a second metal trace deposited on said dielectric layer in alignment with and generally parallel to said first metal trace, said second metal trace having a trace width and a trace length, said second metal trace having first and second ends, said first end of said second metal trace aligned with said first end of said first metal trace, said second end of said second metal trace aligned with said second end of said first metal trace;

(f) a second output terminal electrically connected to said first end of said second metal trace;

(g) said first end of said first metal trace electrically connected to said second end of said second metal trace; and (h) an input terminal electrically connected between said first end of said first metal trace and said second end of said second metal trace;

(i) wherein said first and second metal traces form a balanced transmission line having a line impedance and operational frequency, said line impedance determined by said width of said first and second metal traces, said operational frequency determined by said length of said first and second metal traces.

10. A thick film multilayer microwave construct, comprising:

(a) a high alumina content ceramic substrate base;

(b) a first metal trace deposited on said substrate base, said first metal trace having a trace width and a trace length, said first metal trace having first and second ends;

(c) a dielectric layer deposited over said first metal trace, said dielectric layer having a nominal thickness of 0.003 inches;

(d) a second metal trace deposited on said dielectric layer in alignment with and generally parallel to said first metal trace, said second metal trace having a trace width and a trace length, said second metal trace having first and second ends, said first end of said second metal trace aligned with said first end of said first metal trace, said second end of said second metal trace aligned with said second end of said first metal trace; and (e) an input terminal electrically connected to said first end of said second metal trace;

(f) said first and second ends of said first metal trace electrically connected to ground;

(g) wherein said first and second metal traces form a balanced transmission line having a line impedance and operational frequency, said line impedance determined by said width of said first and second metal traces, said operational frequency determined by said length of said first and second metal traces.

11. A thick film multilayer microwave construct, comprising:

(a) a high alumina content ceramic substrate base;

(b) a first metal trace deposited on said substrate base, said first metal trace having a trace width and a trace length, said first metal trace having first and second ends;

(c) a first output terminal electrically connected to said second end of said first metal trace;

(d) a dielectric layer deposited over said first metal trace, said dielectric layer having a nominal thickness of 0.003 inches;

(e) a second metal trace deposited on said dielectric layer in alignment with and generally parallel to said first metal trace, said second metal trace having a trace width and a trace length, said second metal trace having first and second ends, said first end of said second metal trace aligned with said first end of said first metal trace, said second end of said second metal trace aligned with said second end of said first metal trace;

(f) a second output terminal electrically connected to said first end of said second metal trace;

(g) said first end of said first metal trace electrically connected to said second end of said second metal trace; and (h) an input terminal electrically connected between said first end of said first metal trace and said second end of said second metal trace;

(i) wherein said first and second metal traces form a balanced transmission line having a line impedance and operational frequency, said line impedance determined by said width of said first and second metal traces, said operational frequency determined by said length of said first and second metal traces.

* * * * *